United States Patent Office 3,452,288
Patented June 24, 1969

3,452,288
DC AND HIGH FREQUENCY TRANSISTOR AMPLIFIER CIRCUIT

Masao Kawashima, Yokohama-shi, and Isao Fudemoto, Kawasaki-shi, Japan, assignors to Fujitsu Limited, Kawasaki, Japan, a corporation of Japan
Filed Jan. 4, 1967, Ser. No. 607,255
Claims priority, application Japan, Jan. 8, 1966, 41/888
Int. Cl. H03f 3/18, 3/42, 3/68
U.S. Cl. 330—17 6 Claims

ABSTRACT OF THE DISCLOSURE

In a DC and high frequency transistor amplifier circuit the emitter electrode of a first transistor is connected to the collector electrode of a second transistor through an impedance and the collector electrode of the first transistor is directly connected to the base electrode of the second transistor. A DC signal input and a high frequency signal input are connected to the base electrode of the first transistor. A DC signal output is connected to the emitter electrode of the first transistor and the collector electrode of the second transistor and a high frequency output is connected to the emitter electrode of the second transistor.

BACKGROUND OF THE INVENTION

*Field of the invention*

The present invention relates to a transistor amplifier circuit. More particularly, the invention relates to a DC and high frequency transistor amplifier circuit.

An amplifier circuit which utilizes a minimum magnitude of electrical power and which amplifies both DC and high frequency signals is extremely important in an unattended repeater station of a communication system such as a pulse code modulation or PCM system. Such an amplifier circuit is very useful and desirable in the timing circuit and automatic threshold circuit of such a repeater.

*Description of the prior art*

FIG. 1 shows a prior art regenerative repeater of a PCM system. In FIG. 1, an input signal to the regenerative repeater is supplied to the input of a preamplifier circuit 11 via input terminals 12 and 13 and leads 14 and 15, respectively. The output of the preamplifier circuit 11 is inductively coupled via the input winding 16 of a coupling transformer 17 to the input of a timing circuit 18, the input of a gate circuit 19 and the input of an automatic threshold circuit 21.

The input of the timing circuit 18 is connected to an output winding 22 of the transformer 17 via leads 23 and 24 and 25 and 26, respectively. The input of the gate circuit 19 is connected to the output winding 22 of the transformer 17 via leads 23 and 24. The output of the timing circuit 18 is connected to the control input of the gate circuit 19 via lead 27. The input of the automatic threshold circuit 21 is connected to an output winding 28 via leads 29 and 31. The output of the automatic threshold circuit 21 is connected to a tap point 32 on the output winding 22 of the transformer 17 via lead 33.

The output of the gate circuit 19 is connected to the input of a regenerative amplifier 34 via leads 35 and 36. The output of the regenerative amplifier 34 is connected to output terminals 37 and 38 via leads 39 and 41, respectively. The operation of the regenerative repeater of FIG. 1 is well known. The automatic threshold circuit 21 may comprise a peak detector and a DC amplifier. The output current of the peak detector, which is usually about several tens of microamperes, must be amplified to a magnitude equal to the current of the gate circuit 19, which is usually about 5 to 15 milliamperes, in order to control the conductive condition of said gate circuit with said output current.

FIG. 2 shows a DC amplifier of the prior art which may be utilized in the automatic threshold circuit 21 of FIG. 1. In FIG. 2, an input signal is supplied to the base electrode of a common collector connected transistor 44 via an input terminal 45 and a lead 46. The transistor 44 is a PNP type transistor having emitter, collector and base electrodes. An output signal is supplied to a load 47 via a lead 48 connected to the emitter electrode of the transistor 44, an output terminal 49 and a lead 51.

The timing circuit 18 of FIG. 1 comprises a full-wave rectifier, a high frequency amplifier, a tuning circuit, a tuner and amplifier circuit, an amplitude limiter, a pulse amplifier and a differentiator circuit. The timing circuit generally functions with a single high frequency signal. The high frequency amplifier circuit of the timing circuit 18 generally must have a relatively low output impedance, since the tuning circuit is driven by the voltage source. In operation, the high frequency peak current supplied to the tuning circuit may be about 10 milliamperes, so that a DC bias of over 10 milliamperes is supplied to the final stage of the high frequency amplifier.

FIG. 3 shows a high frequency amplifier of the prior art which may be utilized in the timing circuit 18 of FIG. 1. In FIG. 3, an input signal is supplied to the base electrode of a first transistor 54 via an input terminal 55, a lead 56 and a coupling capacitor 57. The collector electrode of the first transistor 54 is coupled to the base electrode of a second transistor 58 via a lead 59 and a capacitor 61. An output terminal 62 is coupled to the emitter electrode of the second transistor 58 via a lead 63 and a capacitor 64.

A base resistor 65, a collector resistor 66 and an emitter resistor 67 are connected to the base electrode, collector electrode and emitter electrode, respectively, of the first transistor 54. A base resistor 68 and an emitter resistor 69 are connected to the base electrode and emitter electrode, respectively, of the first transistor 54.

The first transistor 54, the capacitor 57 and the resistors 65, 66 and 67 function together as a high frequency amplifier of current feedback type. The second transistor 58, the capacitors 61 and 64 and the resistors 68 and 69 function together as a high frequency amplifier of common collector type having a relatively low output impedance. Each of the first and second transistors 54 and 58 of FIG. 3 are of NPN type.

SUMMARY OF THE INVENTION

The principal object of the present invention is to provide a new and improved DC and high frequency amplifier circuit. The amplifier circuit of the present invention is a transistor circuit. The amplifier circuit of the present invention amplifies both DC and high frequency signals in a single circuit and thus consumes considerably less power than the prior art circuitry wherein separate circuits amplified DC signals and high frequency signals. Furthermore, the amplifier circuit of the present invention comprises a simple structure and considerably fewer components than the equivalent prior art circuitry. The amplifier circuit of the present invention either combines or separates the output DC and high frequency signals with facility and functions efficiently, effectively and reliably.

In accordance with the present invention, a DC and high frequency transistor amplifier comprises a first transistor having emitter, collector and base electrodes. A second transistor has emitter, collector and base electrodes and is connected in cascade with the first transistor. A connector connects the emitter electrode of the first transistor to the collector electrode of the second transistor through an impedance for passing a DC. A further connector directly connects the collector electrode of the first transistor to the base electrode of the second transistor. A circuit connects a DC signal input for a DC signal and a high frequency signal input for a high frequency signal to the base electrode of the first transistor. A further circuit connects a DC signal output for a DC signal to the emitter electrode of the first transistor and the collector electrode of the second transistor and connects a high frequency signal output for a high frequency signal to the emitter electrode of the second transistor.

BRIEF DESCRIPTION OF THE DRAWINGS

In order that the present invention may be readily carried into effect, it will now be described with reference to the accompanying drawings, wherein.

DESCRIPTION OF THE PREFERRED EMBODIMENT

Figure 3:
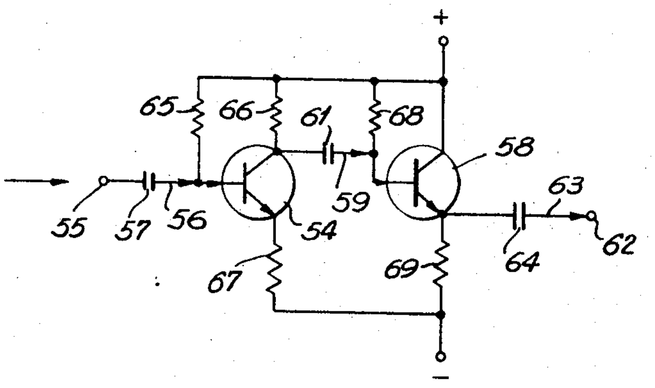
FIG. 3 PRIOR ART
FIG. 3 is a circuit diagram of a high frequency amplifier circuit of the prior art which may be utilized in the regenerative repeater of FIG. 1.
Figure 4:
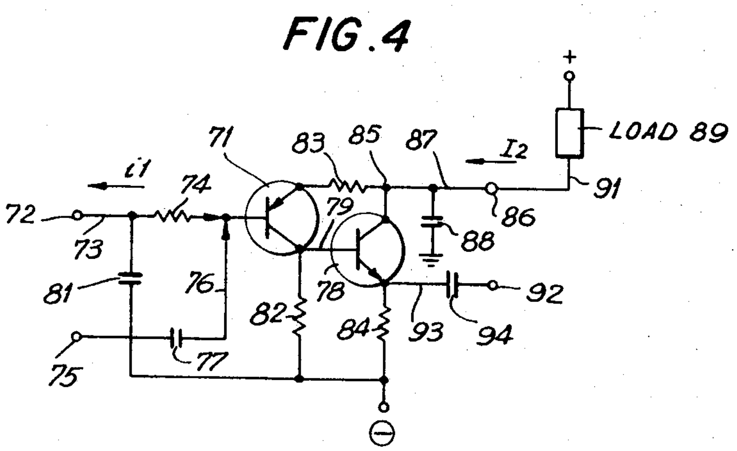
FIG. 4 is a circuit diagram of an embodiment of a DC and high frequency amplifier circuit of the present invention.

FIG. 4 discloses the DC and high frequency amplifier circuit of the present invention. In FIG. 4, a DC input signal is supplied to the base electrode of a first transistor 71 via a DC input terminal 72, a lead 73 and a resistor 74. A high frequency input signal is supplied to the base electrode of the first transistor 71 via a high frequency input terminal 75, a lead 76 and a coupling capacitor 77. The DC input terminal 72 corresponds to the input terminal 45 of FIG. 2 and the high frequency terminal 75 corresponds to the input terminal 55 of FIG. 3.

The collector electrode of the first transistor 71 is directly connected to the base electrode of a second transistor 78 via a lead 79. The first transitsor 71 is a PNP type high frequency transistor and the second transistor 78 is an NPN type high frequency transistor. A capacitor 81 is connected in parallel with the resistor 74 and said resistor and capacitor function as a filter to separate the DC and high frequency input signals.

A collector resistor 82 is connected to the collector electrode of the first transistor 71. An emitter resistor 83 is connected to the emitter electrode of the first transistor 71. An emitter resistor 84 is connected to the emitter electrode of the second transistor 78. The resistors 82, 83 and 84 determine the operation of the first and second transistors 71 and 78. The emitter electrode of the first transistor 71 is connected to the collector electrode of the second transistor 78 via the resistor 83 and a common point 85 in the connection between the resistor 83 and the collector electrode of the second transistor 78 is connected to a DC signal output terminal 86 via a lead 87 and a parallel-connected high frequency bypass capacitor 88.

A load 89 may be connected to the DC signal output terminal 86 via a lead 91. The emitter electrode of the second transistor 78 is coupled to a high frequency signal output terminal 92 via a lead 93 and a high frequency output coupling capacitor 94. The DC signal output terminal 86 corresponds to the output terminal 49 of FIG. 2 and the high frequency signal output terminal 92 corresponds to the output terminal 62 of FIG. 3.

Figure 1:
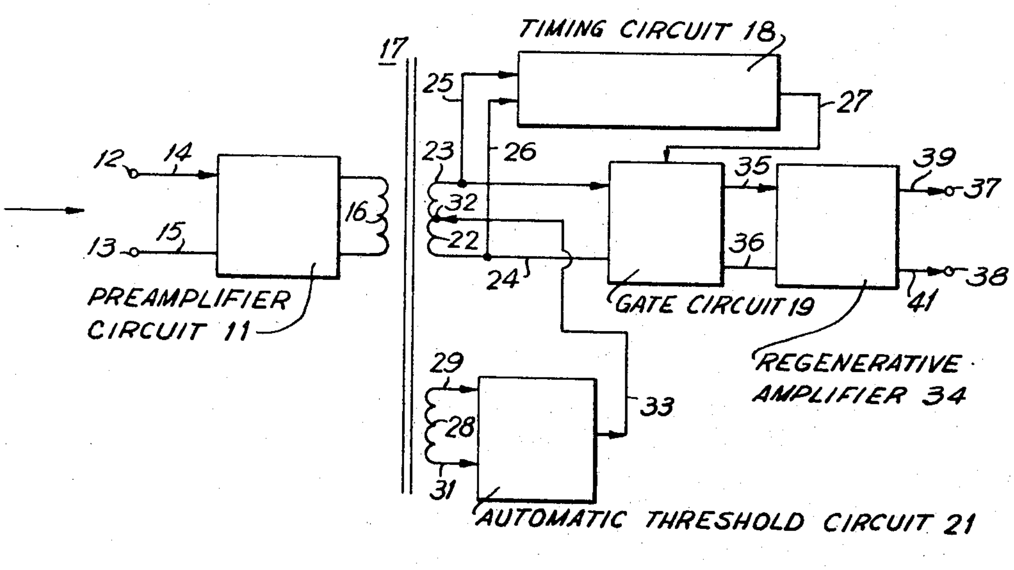
FIG. 1 PRIOR ART
FIG. 1 is a block diagram of a regenerative repeater of the prior art.
Figure 2:
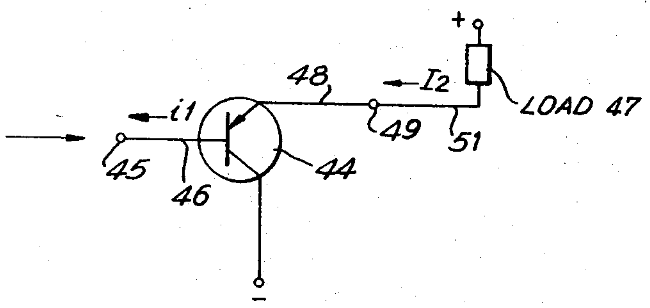
FIG. 2 PRIOR ART
FIG. 2 is a circuit diagram of a DC amplifier circuit of the prior art which may be utilized in the regenerative repeater of FIG. 1.

The amplifier circuit of FIG. 4 functions in the same manner as the circuit of FIG. 2 with regard to the DC signal and in the same manner as the circuit of FIG. 3 with regard to the high frequency signal. Thus, with regard to the DC signal, there is a strong voltage negative feedback between the second transistor 78 and the first transistor 71, so that the voltage amplification factor of the DC signal is nearly 1, as in the circuit of FIG. 2. Furthermore, the current amplification factor A4 of the amplifier circuit of FIG. 4 is greater than the current amplification factor A2 of the amplifier circuit of FIG. 2, as indicated in the following equations, so that the amplifier circuit of FIG. 4 provides an excellent operation as a DC amplifier.

The excellent operation of the amplifier circuit of FIG. 4 as a DC amplifier permits the utilization therein of transistors having a current amplification factor $\beta$ which is less than that of the transistor of FIG. 2.

$$A2=\beta 44+1 \quad (1)$$

$$A4=(\beta 71+1)+\frac{\beta 71\beta 78R82}{R82+(\beta 78+1)R84+VBE78} \quad (2)$$

wherein $\beta 44$ is the current amplification factor of the transistor 44 of FIG. 2, $\beta 71$ is the current amplification factor of the first transistor 71 of FIG. 4, $\beta 78$ is the current amplification factor of the second transistor 78 of FIG. 4, R82 is the resistance of the resistor 82, R84 is the resistance of the resistor 84, and VBE78 is the base-emitter voltage of the second transistor 78.

The amplifier circuit of FIG. 4 functions in the same manner as the circuit of FIG. 3 with regard to the high frequency signal, because the high frequency bypass capacitor 88 connects the common point 85 between the resistor 83 and the collector electrode of the second transistor 78 to a point at ground potential. Part or all of the DC signal is utilized in the amplifier circuit of FIG. 4 as the bias current for the amplification of the high frequency signal. This permits the reduction of the number of components of the circuit and a reduction of electrical power consumed.

Although the first transistor 71 is of PNP type and the second transistor 78 is of NPN type, said first transistor may be of NPN type and said second transistor may be of PNP type, if appropriate polarity changes are made in the circuit.

While the invention has been described by means of a specific example and in a specific embodiment, we do not wish to be limited thereto, for obvious modifications will occur to those skilled in the art without departing from the spirit and scope of the invention.

We claim:

1. A DC and high frequency transistor amplifier circuit comprising
- a first transistor having emitter, collector and base electrodes;
- a second transistor having emitter, collector and base electrodes and connected in cascade with said first transistor;
- impedance means for passing a DC;
- connecting means connecting the emitter electrode of said first transistor to the collector electrode of said second transistor through said impedance means;
- further connecting means directly connecting the collector electrode of said first transistor to the base electrode of said second transistor;
- DC signal input means for a DC signal;
- high frequency signal input means for a high frequency signal;
- circuit means connecting said DC signal input means and said high frequency signal input means to the base electrode of said first transistor, said circuit means comprising filter means for separating said DC and high frequency signals and means connecting said DC signal input means to the base electrode of said first transistor via said filter means;
- DC signal output means for a DC signal;
- high frequency signal output means for high frequency signal; and
- further circuit means connecting said DC signal output means to the emitter electrode of said first transistor and the collector electrode of said second transistor and connecting said high frequency signal output means to the emitter electrode of said second transistor.

2. A DC and high frequency transistor amplifier circuit as claimed in claim 1, wherein said circuit means further comprises a coupling capacitor and means coupling said high frequency signal input means to the base electrode of said first transistor via said coupling capacitor.

3. A DC and high frequency transistor amplifier circuit as claimed in claim 2, wherein said further circuit means comprises connecting means connecting the emitter electrode of said first transistor and the collector electrode of said second transistor to said DC signal output means and a high frequency bypass capacitor connected to said connecting means.

4. A DC and high frequency transistor amplifier circuit as claimed in claim 3, wherein said further circuit means further comprises a high frequency output coupling capacitor and means coupling the emitter electrode of said second transistor to said high frequency signal output means via said output coupling capacitor.

5. A DC and high frequency transistor amplifier circuit comprising a first transistor having emitter, collector and base electrodes;

a second transistor having emitter, collector and base electrodes and connected in cascade with said first transistor;

impedance means for passing a DC;

connecting means connecting the emitter electrode of said first transistor to the collector electrode of said second transistor through said impedance means;

further connecting means directly connecting the collector electrode of said first transistor to the base electrode of said second transistor;

DC signal input means for a DC signal;

high frequency signal input means for a high frequency signal;

circuit means connecting said DC signal input means and said high frequency signal input means to the base electrode of said first transistor;

DC signal output means for a DC signal;

high frequency signal output means for a high frequency signal; and further circuit means connecting said DC signal output means to the emitter electrode of said first transistor and the collector electrode of said second transistor and connecting said high frequency signal output means to the emitter electrode of said second transistor, said further circuit means comprising connecting means connecting the emitter electrode of said first transistor and the collector electrode of said second transistor to said DC signal output means and a high frequency bypass capacitor connected to said connecting means.

6. A DC and high frequency transistor amplifier circuit as claimed in claim 5, wherein said further circuit means further comprises a high frequency output coupling capacitor and means coupling the emitter electrode of said second transistor to said high frequency signal output means via said output coupling capacitor.

References Cited

UNITED STATES PATENTS

| | | | |
|---|---|---|---|
| 3,204,191 | 8/1965 | Redwood | 330—19 X |
| 3,217,175 | 11/1965 | Henness | 307—88.5 |

ROY LAKE, *Primary Examiner.*

SIEGFRIED H. GRIMM, *Assistant Examiner.*

U.S. Cl. X.R.

330—19, 20, 30, 125, 147, 148